(12) United States Patent
Doo et al.

(10) Patent No.: US 8,570,132 B2
(45) Date of Patent: Oct. 29, 2013

(54) POWER ELECTRONICS ASSEMBLY WITH MULTI-SIDED INDUCTOR COOLING

(75) Inventors: Yong M. Doo, La Palma, CA (US);
Mark D. Korich, Chino Hills, CA (US);
Konstantinos Triantos, Huntington Beach, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 812 days.

(21) Appl. No.: 12/606,803

(22) Filed: Oct. 27, 2009

(65) Prior Publication Data

US 2011/0096496 A1    Apr. 28, 2011

(51) Int. Cl.
*H01F 27/02* (2006.01)

(52) U.S. Cl.
USPC .......................................... 336/90

(58) Field of Classification Search
USPC ............................... 336/55–62, 90
See application file for complete search history.

(56) References Cited

U.S. PATENT DOCUMENTS

| | | | |
|---|---|---|---|
| 2,615,075 A | | 10/1952 | Paluev |
| 4,909,996 A | * | 3/1990 | Uys .......................... 422/186.07 |
| 7,113,065 B2 | * | 9/2006 | Skibinski ........................ 336/90 |
| 7,508,289 B1 | * | 3/2009 | Wernicki ........................ 336/55 |
| 8,081,462 B2 | * | 12/2011 | Balcerak et al. .............. 361/701 |
| 2005/0068147 A1 | | 3/2005 | Skibinski |
| 2008/0117602 A1 | | 5/2008 | Korich et al. |
| 2009/0179721 A1 | * | 7/2009 | Wernicki ........................ 336/60 |
| 2011/0227681 A1 | * | 9/2011 | MacLennan .................... 336/57 |

OTHER PUBLICATIONS

China Patent & Trademark Office. Chinese Office Action dated Jan. 17, 2013 for Chinese Patent Application for Invention No. 201010525878.9.

* cited by examiner

*Primary Examiner* — Tuyen Nguyen
(74) *Attorney, Agent, or Firm* — Ingrassia Fisher & Lorenz, P.C.

(57) ABSTRACT

A power electronics assembly is provided. The assembly includes a housing defining at least one cavity and having a fluid passageway extending therethrough, the fluid passageway having first and second portions on respective first and second opposing sides of the at least one cavity, and a plurality of inductors housed within the at least one cavity of the housing such that the first and second portions of the fluid passageway are on first and second opposing sides of each of the plurality of inductors.

8 Claims, 8 Drawing Sheets

US 8,570,132 B2

POWER ELECTRONICS ASSEMBLY WITH MULTI-SIDED INDUCTOR COOLING

TECHNICAL FIELD

The present invention generally relates to power electronics, and more particularly relates to an automotive power electronics assembly with multi-sided inductor cooling.

BACKGROUND OF THE INVENTION

In recent years, advances in technology, as well as ever-evolving tastes in style, have led to substantial changes in the design of automobiles. One of the changes involves the complexity of the electrical systems within automobiles, particularly alternative fuel (or propulsion) vehicles that utilize voltage supplies, such as hybrid and battery electric vehicles. Such alternative fuel vehicles typically use one or more electric motors, often powered by batteries, perhaps in combination with another actuator, to drive the wheels.

Such vehicles often use two separate voltage sources, such as a battery and a fuel cell, to power the electric motors that drive the wheels. Power electronics (or power electronics systems), such as direct current-to-direct current (DC/DC) converters, are typically used to manage and transfer the power from the two voltage sources. Also, due to the fact that alternative fuel automobiles typically include only direct current (DC) power supplies, direct current-to-alternating current (DC/AC) inverters (or power inverters) are also provided to convert the DC power to alternating current (AC) power, which is generally required by the motors.

As the power demands on the electrical systems in alternative fuel vehicles continue to increase, there is an ever-increasing need to maximize the electrical efficiency of such systems. There is also a constant desire to reduce the size of the components within the electrical systems in order to minimize the overall cost and weight of the vehicles. Such demands extend not only to the electrical components themselves, but to the components and systems used to regulate the temperature (e.g., cooling) of the electrical components.

Accordingly, it is desirable to provide a power electronics assembly with an improved system and/or method for temperature regulation. Furthermore, other desirable features and characteristics of the present invention will become apparent from the subsequent description taken in conjunction with the accompanying drawings and the foregoing technical field and background.

SUMMARY OF THE INVENTION

A power electronics assembly is provided. The assembly includes a housing defining at least one cavity and having a fluid passageway extending therethrough, the fluid passageway having first and second portions on respective first and second opposing sides of the at least one cavity, and a plurality of inductors housed within the at least one cavity of the housing such that the first and second portions of the fluid passageway are on first and second opposing sides of each of the plurality of inductors.

An automotive power converter assembly is provided. The assembly includes a housing comprising first and second side walls and defining a plurality of inductor cavities and a fluid passageway extending therethrough, the fluid passageway having first and second portions within the respective first and second side walls on respective first and second opposing sides of the plurality of inductor cavities, a plurality of inductors, each of the inductors housed within a respective one of the plurality of inductor cavities of the housing such that the first and second portions of the fluid passageway are on first and second opposing sides of each of the plurality of inductors, and a plurality of power modules coupled to the housing and arranged such that the fluid passageway extends between the plurality of power modules and the plurality of inductors, each of the plurality of power modules comprising a power switching device electrically connected to a respective one of the plurality of inductors.

An automotive drive system is provided. The drive system includes an electric motor, at least one direct current (DC) voltage supply coupled to the electric motor, power electronics assembly, and a processing system in operable communication with the electric motor, the at least one DC voltage supply, and the power electronics assembly. The power electronics assembly includes a housing defining at least one cavity and having a fluid passageway extending therethrough, the fluid passageway having first and second portions on respective first and second opposing sides of the at least one cavity, a plurality of inductors housed within the at least one cavity of the housing such that the first and second portions of the fluid passageway are on first and second opposing sides of each of the plurality of inductors, and a plurality of power modules coupled to the housing such that the fluid passageway extends between the plurality of inductors and the power modules, each of the power modules comprising a power switching device.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, and brief summary, or the following detailed description.

The following description refers to elements or features being "connected" or "coupled" together. As used herein, "connected" may refer to one element/feature being mechanically joined to (or directly communicating with) another element/feature, and not necessarily directly. Likewise, "coupled" may refer to one element/feature being directly or indirectly joined to (or directly or indirectly communicating with) another element/feature, and not necessarily mechanically. However, it should be understood that although two elements may be described below, in one embodiment, as being "connected," in alternative embodiments similar elements may be "coupled," and vice versa. Thus, although the schematic diagrams shown herein depict example arrangements of elements, additional intervening elements, devices, features, or components may be present in an actual embodiment.

Further, various components and features described herein may be referred to using particular numerical descriptors, such as first, second, third, etc., as well as positional and/or angular descriptors, such as horizontal and vertical. However, such descriptors may be used solely for descriptive purposes relating to drawings and should not be construed as limiting, as the various components may be rearranged in other embodiments. It should also be understood that FIGS. 1-12 are merely illustrative and may not be drawn to scale.

FIG. 1 to FIG. 12 illustrate a power electronics assembly. The assembly includes a housing defining at least one cavity and having a fluid passageway extending therethrough. The fluid passageway has first and second portions on respective first and second opposing sides of the at least one cavity. A plurality of inductors are housed within the at least one cavity of the housing such that the first and second portions of the fluid passageway are on first and second opposing sides of each of the plurality of inductors.

The power electronics assembly may be used, for example, in a direct current-to-direct current (DC/DC) power converter or a direct current-to-alternating current (DC/AC) inverter assembly. The power electronics assembly may also include one or more power modules mounted to the housing such that the fluid passageway extends between inductors and the power module(s), allowing heat to be transferred from both.

Figure 1:
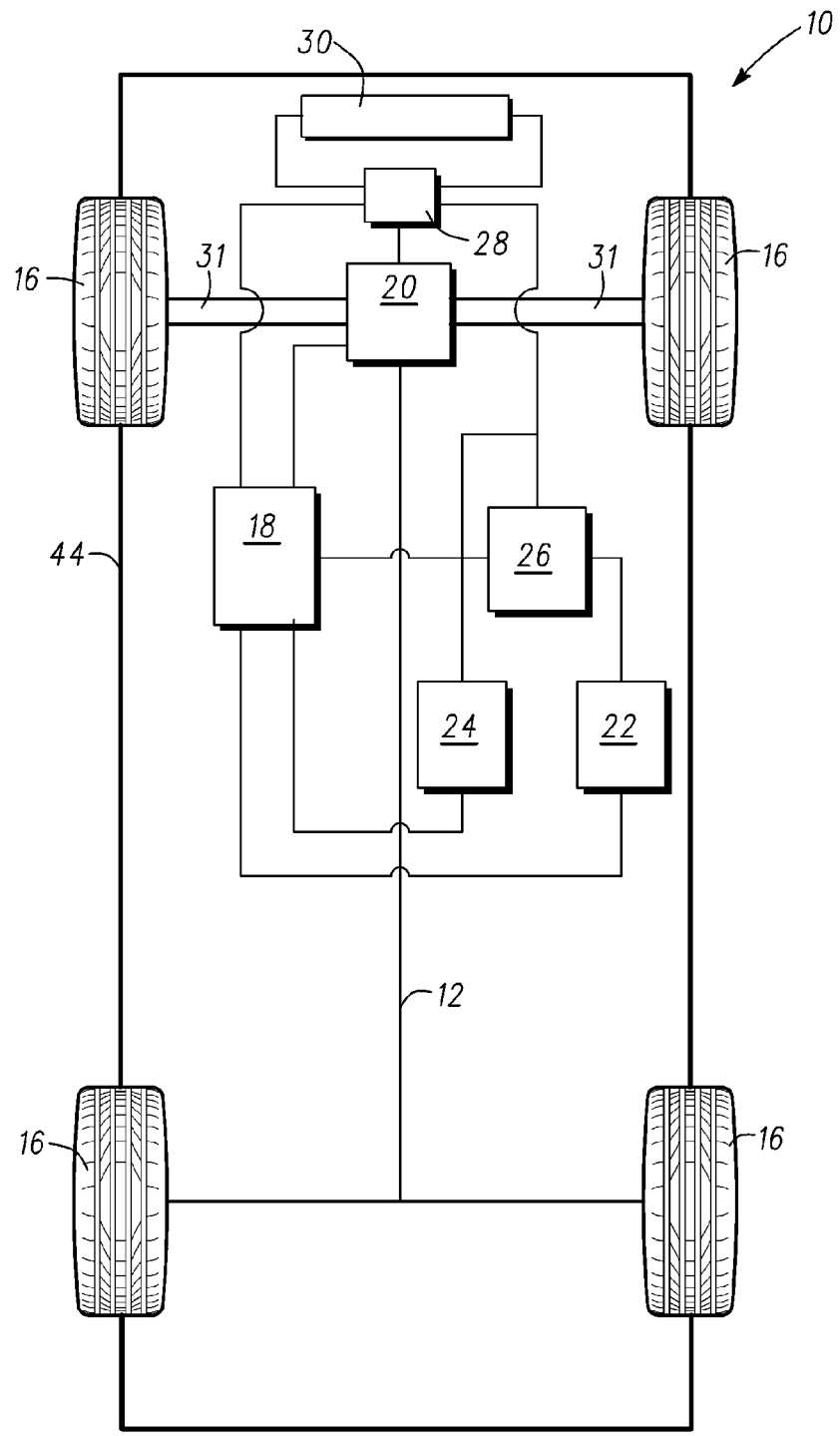
FIG. 1 is a schematic view of an exemplary automobile according to one embodiment of the present invention.

FIG. 1 illustrates a vehicle, or automobile 10, according to one embodiment of the present invention. The automobile 10 includes a chassis 12, a body 14, four wheels 16, and an electronic control system 18. The body 14 is arranged on the chassis 12 and substantially encloses the other components of the automobile 10. The body 14 and the chassis 12 may jointly form a frame. The wheels 16 are each coupled to the chassis 12 near a respective corner of the body 14.

The automobile 10 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). The automobile 10 may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, a combustion/electric motor hybrid engine (i.e., such as in a hybrid electric vehicle (HEV)), and an electric motor.

In the exemplary embodiment illustrated in FIG. 1, the automobile 10 is a fuel cell vehicle, and further includes an electric motor/generator 20, a battery 22, a fuel cell power module (FCPM) 24, a DC/DC converter system (or a first power converter) 26, a DC/AC inverter (or a second power converter) 28, and a radiator 30. Although not illustrated, the electric motor/generator 20 (or motor) includes a stator assembly (including conductive coils), a rotor assembly (including a ferromagnetic core), and a cooling fluid (i.e., coolant), as will be appreciated by one skilled in the art. The motor 20 may also include a transmission integrated therein such that the motor 20 and the transmission are mechanically coupled to at least some of the wheels 16 through one or more drive shafts 31.

As shown, the battery 22 and the FCPM 24 are in operable communication and/or electrically connected to the electronic control system 18 and the DC/DC converter system 26. Although not illustrated, the FCPM 24, in one embodiment, includes, amongst other components, a fuel cell having an anode, a cathode, an electrolyte, and a catalyst. As is commonly understood, the anode, or negative electrode, conducts electrons that are freed from, for example, hydrogen molecules so that they can be used in an external circuit. The cathode, or positive electrode (i.e., the positive post of the fuel cell), conducts the electrons back from the external circuit to the catalyst, where they can recombine with the hydrogen ions and oxygen to form water. The electrolyte, or proton exchange membrane, conducts only positively charged ions while blocking electrons. The catalyst facilitates the reaction of oxygen and hydrogen.

Figure 2:
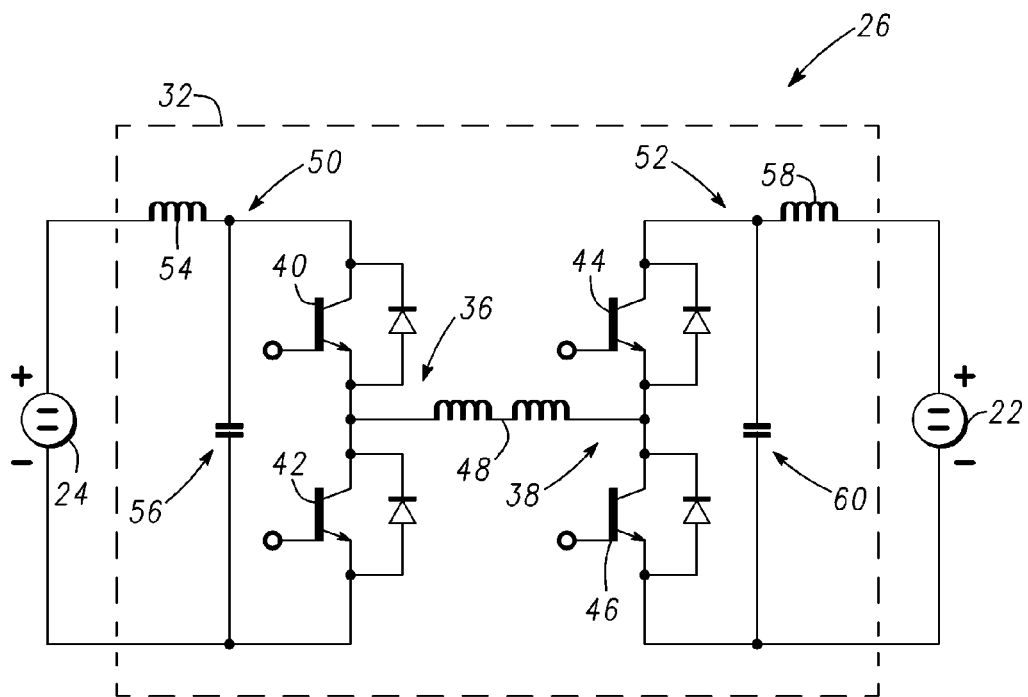
FIG. 2 is a schematic view of a direct current-to-direct current (DC/DC) power converter system within the automobile of FIG. 1.

FIG. 2 schematically illustrates the DC/DC converter system 26 in greater detail, in accordance with an exemplary embodiment of the present invention. In the depicted embodiment, the DC/DC converter system 26 includes a bi-directional DC/DC converter (BDC) 32 coupled to the FCPM 24 and the battery 22. The BDC converter 32, in the depicted embodiment, includes a power switching section with two dual insulated gate bipolar transistor (IGBT) legs 36 and 38, each having two IGBTs, 40 and 42, and 44 and 46, respectively. The two legs 36 and 38 are interconnected at midpoints by a switching inductor (or switching inductors, as described below) 48 having an inductance. The BDC converter 32 also includes a first filter 50 connected to the positive rail of the first IGBT leg 36 and a second filter 52 connected to the positive rail of the second IGBT leg 38. As shown, the filters 50 and 52 include a first inductor 54, a first capacitor 56, a second inductor 58, and a second capacitor 60, respectively. The first IGBT leg 36 is connected to the FCPM 24 through the first filter 50, and the second IGBT leg 38 is connected to the battery 22 through the second filter 52. As shown, the FCPM 24 and the battery are not galvanically isolated, as the negative (−) terminals are electrically connected.

Although not shown, the DC/DC converter system 26 may also include a BDC controller in operable communication with the BDC converter 32. The BDC controller may be implemented within the electronic control system 18 (FIG. 1), as is commonly understood in the art.

Figure 3:
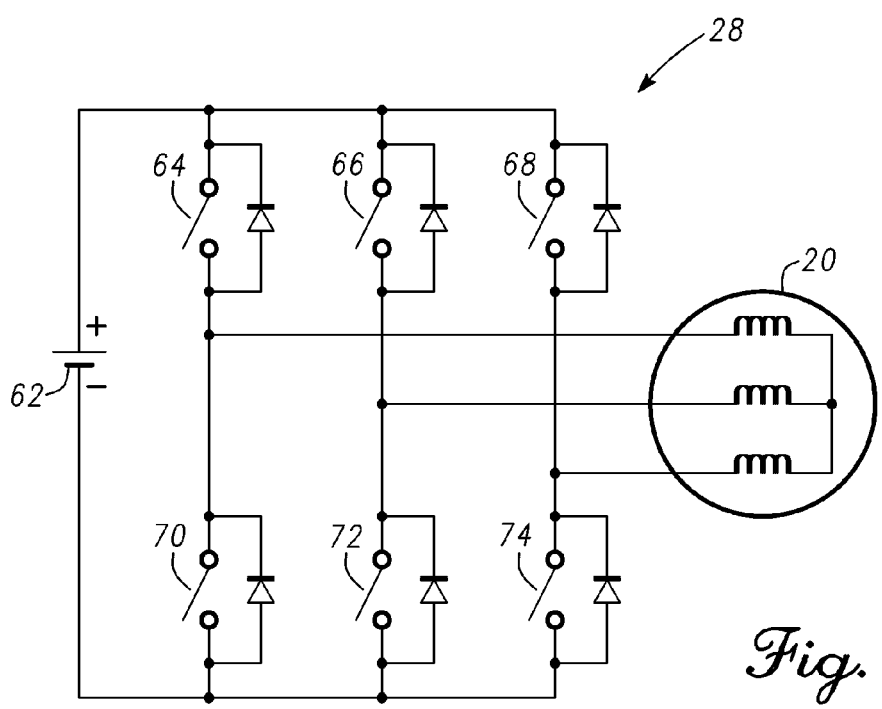
FIG. 3 is a schematic view of a direct current-to-alternating current (DC/AC) power inverter system within the automobile of FIG. 1.

FIG. 3 schematically illustrates the DC/AC inverter 28 in greater detail, in accordance with an exemplary embodiment of the present invention. The inverter 28 includes a three-phase circuit coupled to the motor 20. More specifically, the inverter 28 includes a switch network having a first input coupled to a voltage source 62 (e.g., the battery 22 and/or the FCPM 24 through the DC/DC converter system 26 and an output coupled to the motor 20). Although a single voltage source is shown, a distributed direct current (DC) link with two series voltage sources may be used.

The switch network comprises three pairs of series switches (e.g., IGBTs) with antiparallel diodes (i.e., antiparallel to each switch) corresponding to each of the phases.

Each of the pairs of series switches comprises a first switch, or transistor, (i.e., a "high" switch) 64, 66, and 68 having a first terminal coupled to a positive electrode of the voltage source 62 and a second switch (i.e., a "low" switch) 70, 72, and 74 having a second terminal coupled to a negative electrode of the voltage source 62 and having a first terminal coupled to a second terminal of the respective first switch 64, 66, and 68.

Although not shown, the DC/AC inverter 28 may also include an inverter control module, which may be implemented within the electronic control system 18 (FIG. 1), as is commonly understood in the art. The BDC 32 and the inverter 28 may also include a plurality of power module devices, each including a semiconductor substrate, or electronic die, with an integrated circuit formed thereon, amongst which the switches 40-46 and 64-74 are distributed, as is commonly understood.

Referring again to FIG. 1, the radiator 30 is connected to the frame at an outer portion thereof and although not illustrated in detail, includes multiple cooling channels therethough that contain a cooling fluid (i.e., coolant) such as water and/or ethylene glycol (i.e., "antifreeze) and is coupled to the motor 20, the converter assembly 26, and the inverter 28.

The electronic control system 18 is in operable communication with the motor 20, the battery 22, the FCPM 24, the DC/DC converter system 26, and the inverter 28. Although not shown in detail, the electronic control system 18 includes various sensors and automotive control modules, or electronic control units (ECUs), such as the BDC controller, the inverter control module, and a vehicle controller, and at least one processor and/or a memory which includes instructions stored thereon (or in another computer-readable medium) for carrying out the processes and methods as described below.

FIGS. 4-12 illustrate a power electronics assembly 100 according to one embodiment of the present invention. In an exemplary embodiment, the assembly 100 is used within a DC/DC power converter (e.g., BDC 32). However, it should be understood that the assembly 100 may also be used within a DC/AC power inverter.

Figure 4:
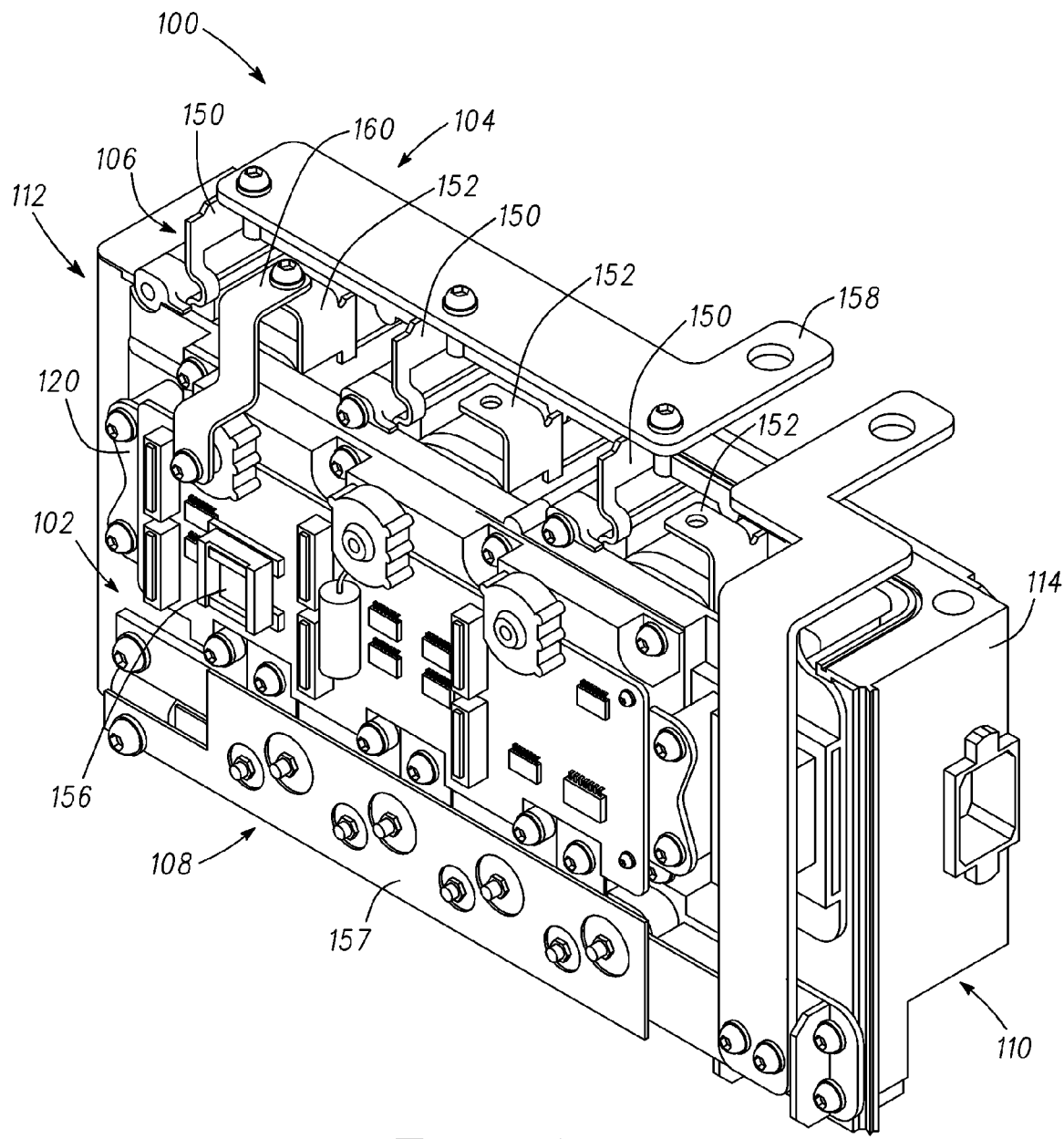
FIG. 4 is an isometric view of a power electronics assembly according to one embodiment of the present invention.

Referring to FIG. 4, the assembly 100 has a substantially rectangular shape. The assembly 100, as well as all of the components within the assembly 100 described below, may be described as having front and back sides 102 and 104, a top (or top side) 106, a bottom (or bottom side) 108, and opposing ends 110 and 112. Among other components, the assembly 100 includes a housing 114 and a power module 116 mounted on the front side 102 thereof.

Figure 5:
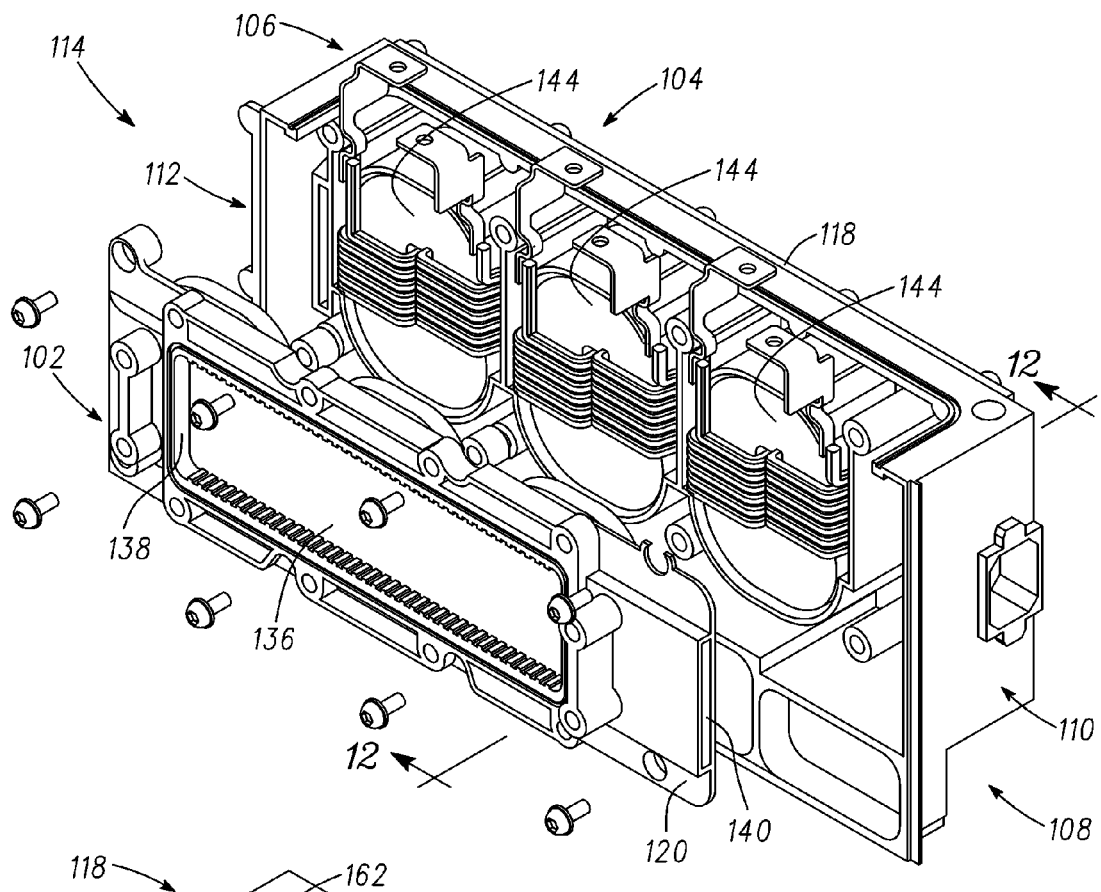
FIG. 5 an exploded isometric view of a housing of the power electronics assembly of FIG. 4.
Figure 6:
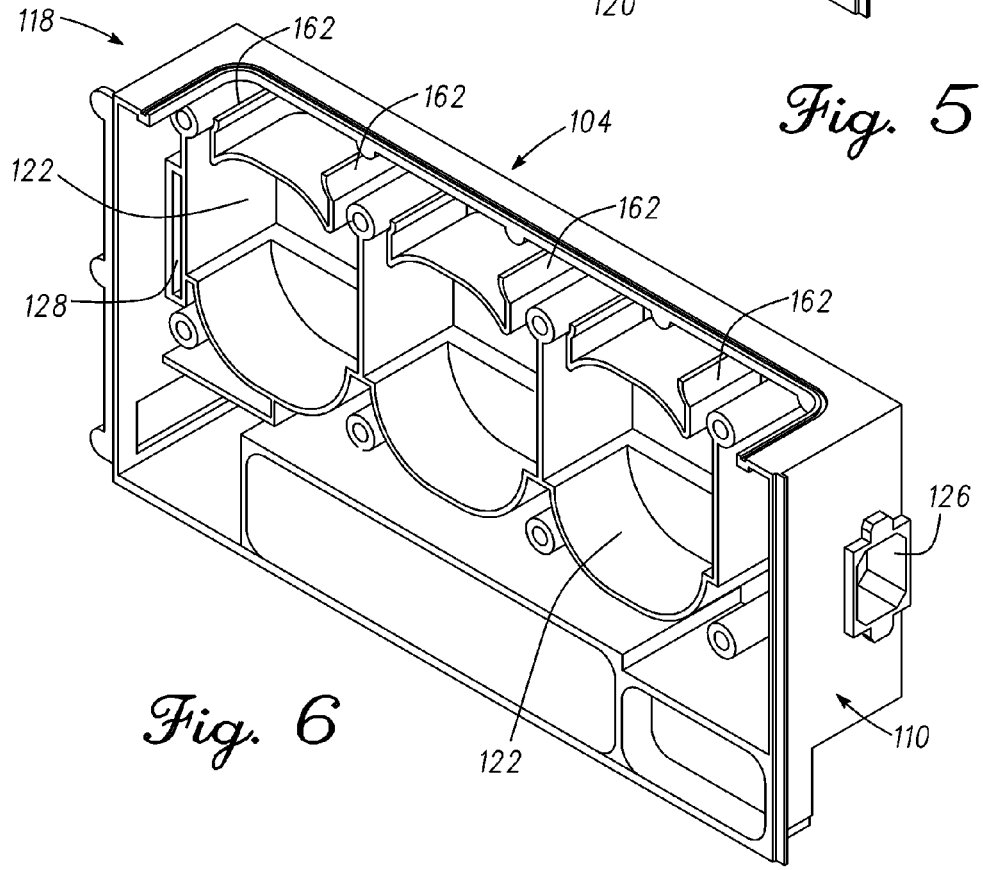
FIGS. 6, 7, and 8 are isometric views of a first piece of the housing of FIG. 5.

FIG. 5 illustrates the housing 114 in an exploded view. The housing 114 includes a primary piece (or back plate) 118 and a secondary piece (or front plate) 120. As is apparent, the primary piece 118 substantially forms the back side 104, the top side 106, the bottom side 108, and the ends 110 and 112 of the housing. Referring to FIG. 6, on a side opposing the back side 104, the primary piece 118 includes, in the depicted embodiment, three inductor pockets (or cavities) 122 that are substantially oval in shape. As will be described in greater detail below, an interior surface of each of the inductor pockets 122 (adjacent to the back side 104) has a winding recess 124 formed thereon.

Figure 7:
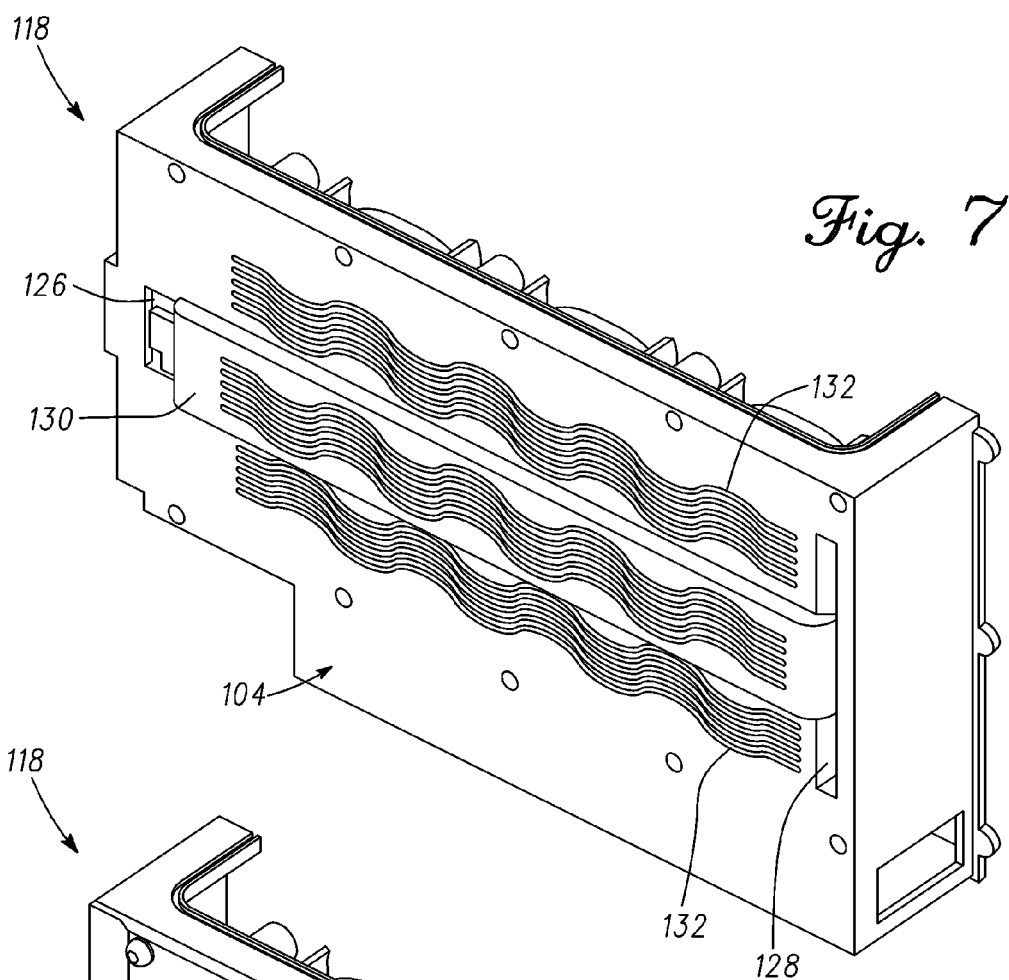
Figure 8:
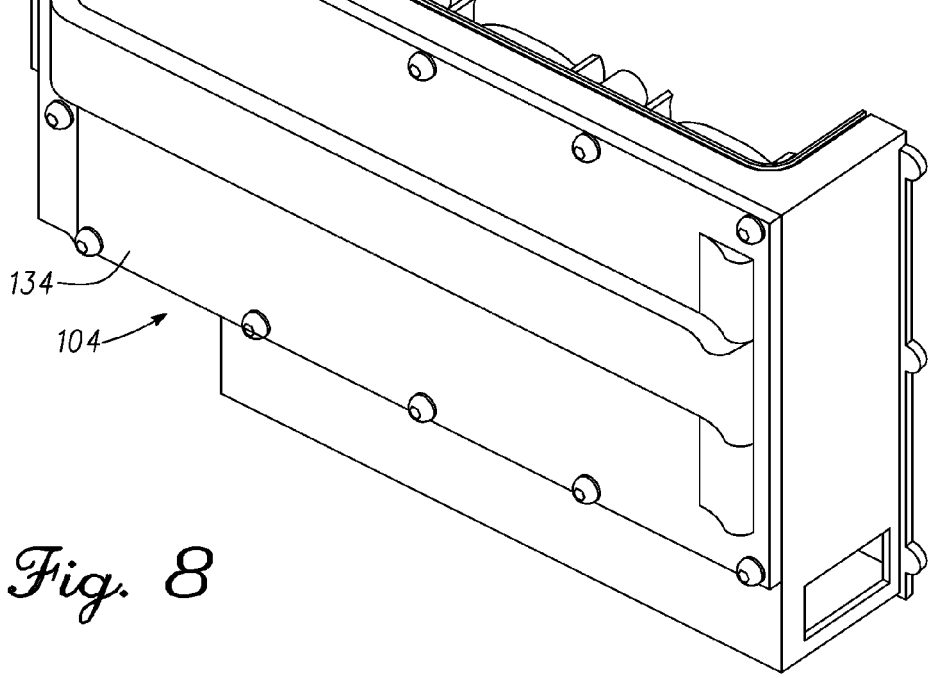

Referring to FIG. 7 in combination with FIG. 6, the primary piece also includes fluid ports 126 and 128. Fluid port 126 extends between end 110 and the back side 104 of the primary piece 118, and fluid port 128 extends from the back side 104 to the opposing side of the primary piece 118. As shown in FIG. 7, on the back side 104, the primary piece 118 has a raised formation 130 formed thereon, which corresponds to the recesses 124 in the inductor pockets 122 (FIG. 6). Also formed on the back side 104, including on the raised formation 130, are several series of cooling fins 132 (i.e., series of raised and recessed formations). In the depicted embodiment, the cooling fins 132 are arranged in pattern of "waves." Although not visible in FIG. 1, as shown in FIG. 8, a back cover 134 is secured to the back side 104 of the primary piece 118. As will be described in greater detail below, the back cover 134 is shaped such that a gap or fluid channel, which interconnects fluid ports 126 and 128, is formed between it and the primary piece 118.

Figure 9:
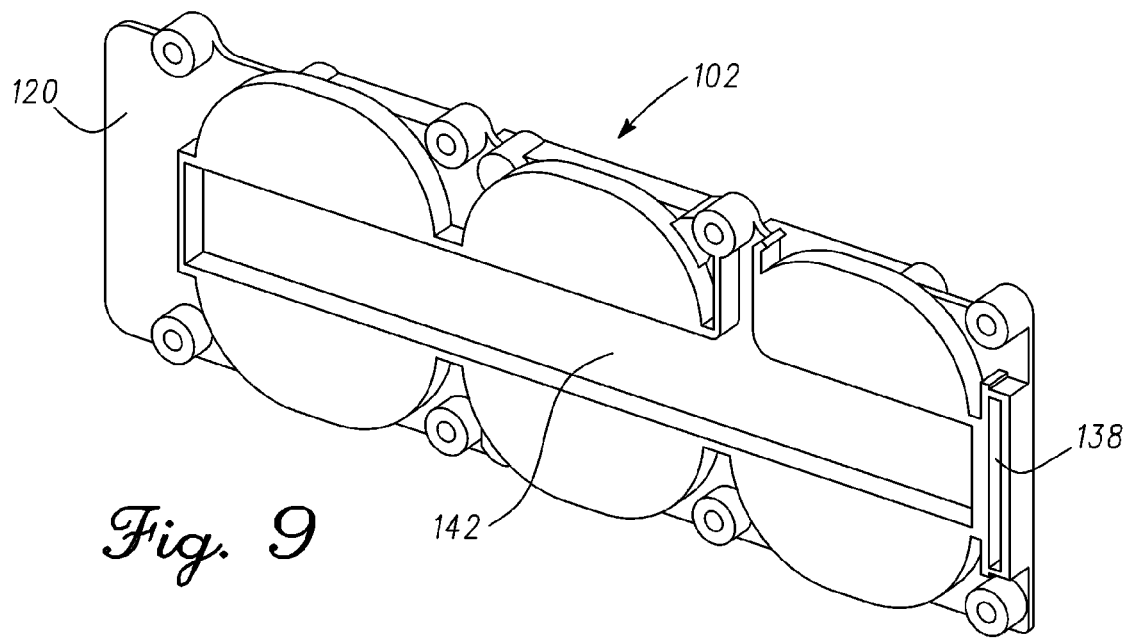
FIG. 9 is an isometric view of a second piece of the housing of FIG. 5.
Figure 10:
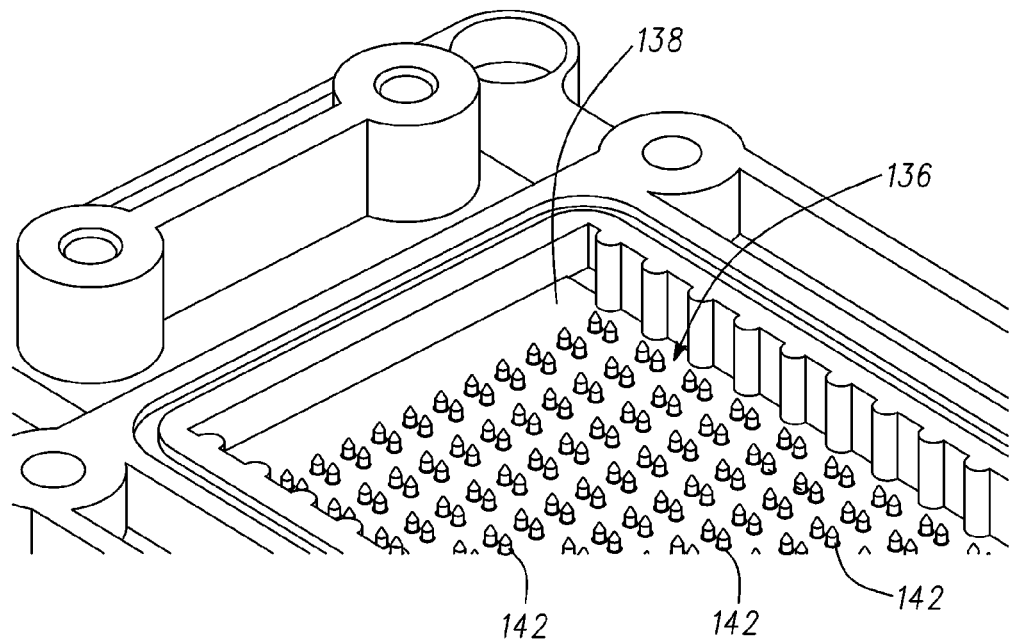
FIG. 10 is an isometric view of a portion of the second piece of the housing.

Referring again to FIG. 5, the secondary piece 120 includes a fluid channel recess 136 on the front side 102 thereof and two fluids ports 138 and 140. Fluid port 138 extends between a side opposite the front side 102 and the channel recess 136, and fluid port 140 extends between the fluid channel recess 136 and end 110 of the housing 114 (when the housing 114 is assembled). As shown in FIG. 9, on the side opposite the front side 102, the secondary piece 120 has a winding recess 142 formed thereon. Referring now to FIG. 10, the inner surface of the fluid channel recess 136 has a plurality of cooling pins 142 (i.e., a series of alternating raised and recessed formations). The primary and secondary pieces 118 and 120 of the housing 114 may be made of a metal, such as an aluminum alloy.

Figure 11:
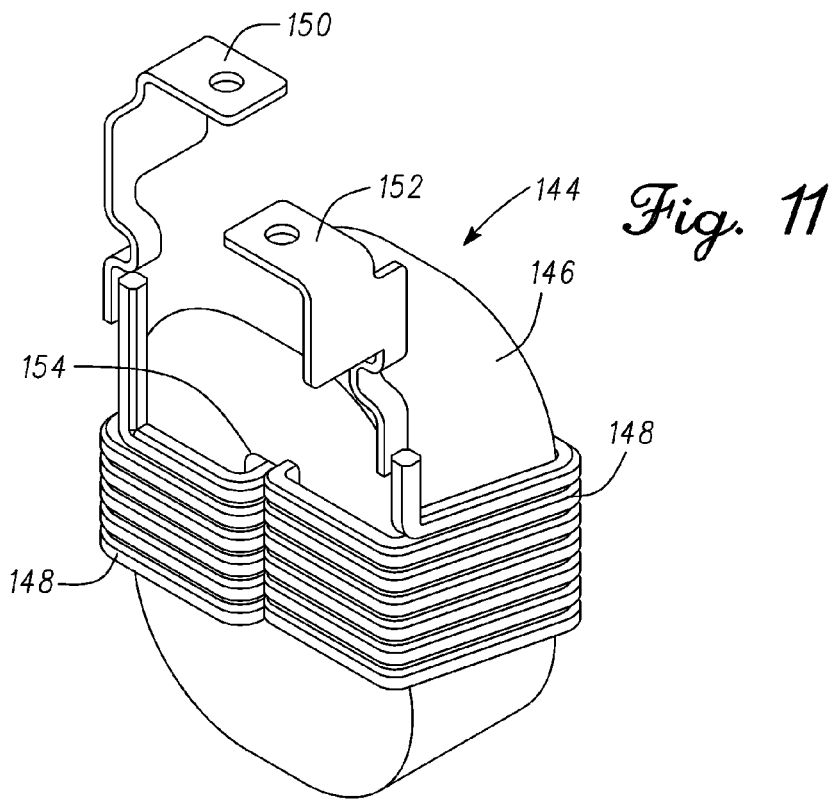
FIG. 11 is an isometric view of an inductor within the housing of FIG. 5.

Referring again to FIGS. 5 and 6, the power electronics assembly 100 also includes, in the depicted embodiment, three inductors 144 (e.g., corresponding to switching inductors 48 in FIG. 2), each of which is located within a respective one of the inductor cavities 122. FIG. 11 illustrates one of the inductors 144 in greater detail. The inductor 144 includes a core 146, a conductive winding 148, and first (positive) and second (negative) terminals 150 and 152. The core 146 is substantially oval in shape and has a winding opening 154 extending through a central portion thereof. The core 146 is made of a ferromagnetic material, such as ferrite, nickel, laminated silicon steel, or other suitable material. The conductive winding 148 is wrapped around portions of the core 146 on opposing sides of the winding opening 154. The terminals 150 and 152 are connected to opposing ends of the conductive winding 148 and suspended thereby at one end of the core 146. The terminals 150 and 152 are made of a conductive material, such as tungsten.

Referring again to FIG. 4, a power module (or power modules) 156 is connected to the secondary piece 120 of the housing 114 via, for example, a copper or aluminum plate, (not shown in detail) which covers the fluid channel recess 136. The power module(s) 156 include one or more power switching devices (e.g., corresponding to IGBTs 40-46 in FIG. 2) formed on semiconductor substrates.

Still referring to FIG. 4, the power electronics assembly 100 also includes a capacitor subassembly 157 (e.g., corresponding to capacitors 56 and 60 in FIG. 2) connected to the housing 114 below the inductors 144. As shown, the first terminals 150 of the inductors are all connected to a common bus bar 158, while the second terminals 152 are each electrically connected to a respective power switching device within the power module(s) 156 via conductors 160. It should be understood that although only one conductor 160 is shown in FIG. 4 more may be provided (e.g., one per power module 156).

Figure 13:
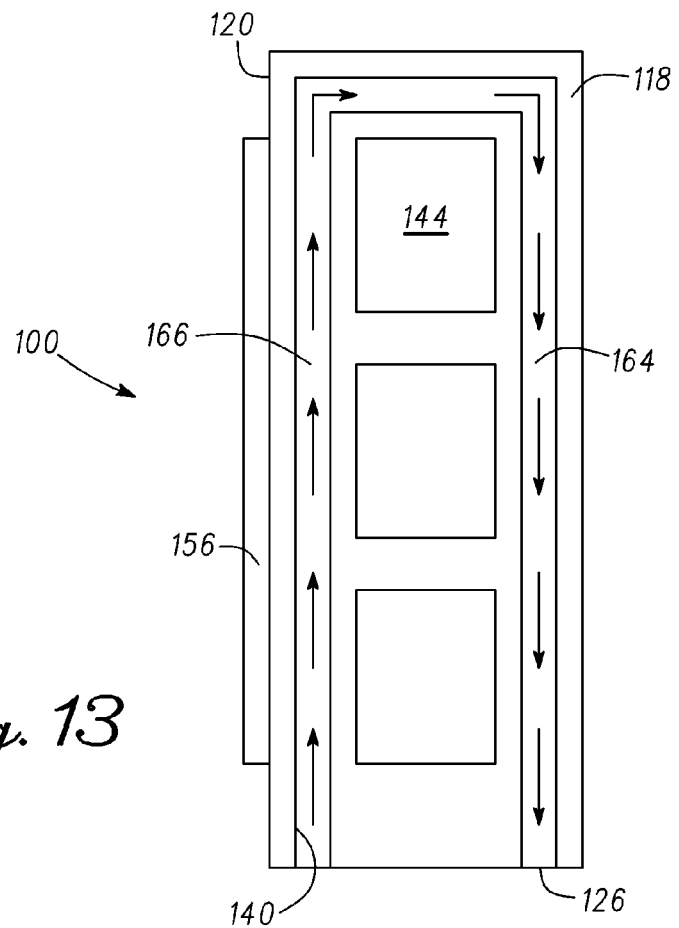
FIG. 13 is a cross-sectional schematic view of the power electronics assembly taken along line 13-13 in FIG. 12, illustrating the flow of fluid through a fluid passageway therein.
Figure 12:
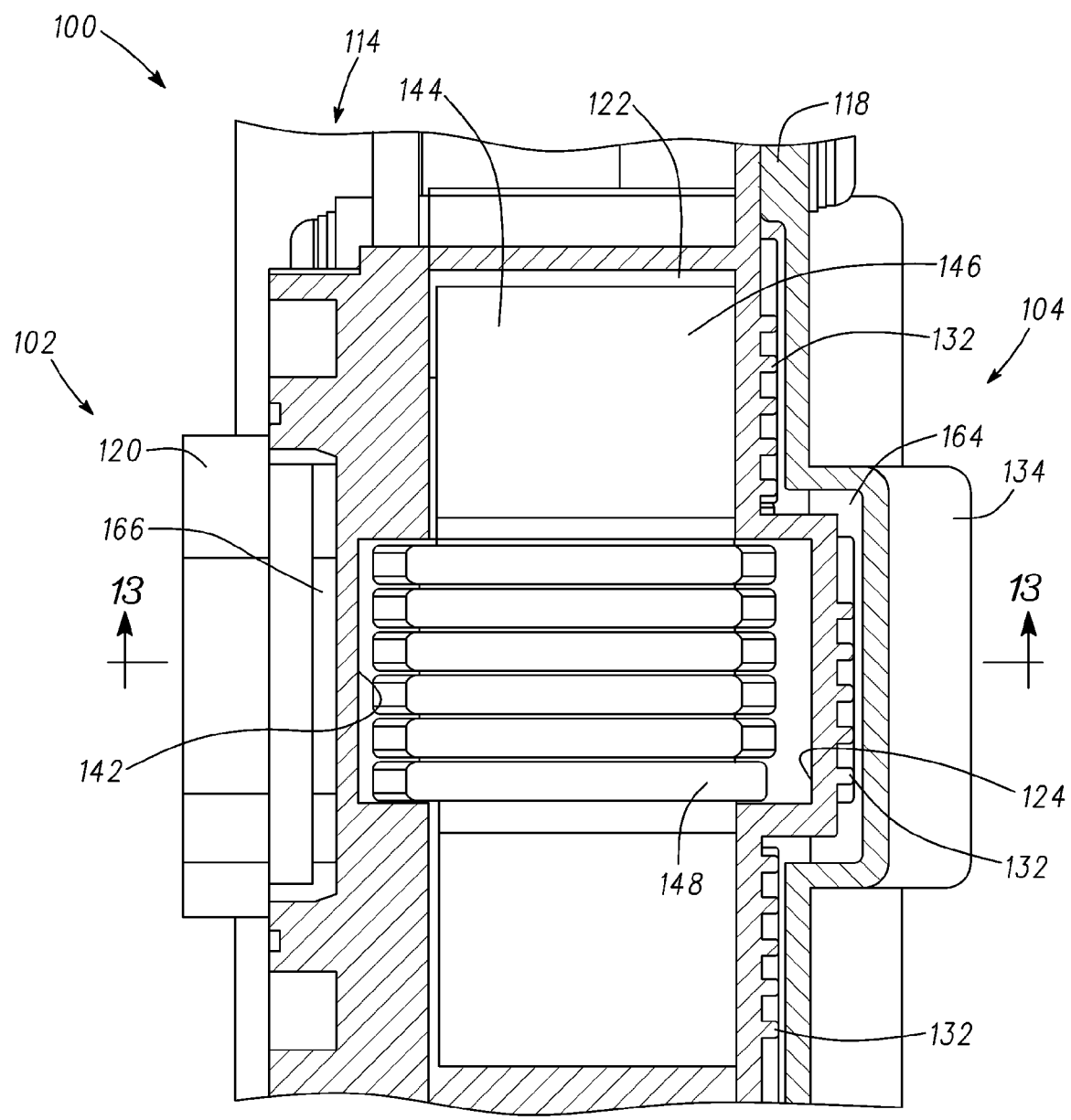
FIG. 12 is a cross-sectional side view of the housing in a non-exploded form taken along line 12-12 in FIG. 5.

Referring now to FIGS. 4, 12, and 13, when the power electronics assembly 100 is assembled, the inductors 144 sit within the inductor pockets 122 such that the core 146 of each is in close proximity (e.g., 1-2 mm) to the non-recessed portions of the inner surfaces of the primary and secondary pieces 118 and 120 of the housing 114. Additionally, the winding 148 of each inductor is at least partially positioned within (and may be within similar proximities to) the winding recesses 124 and 142 on both the primary and secondary pieces 118 and 120 of the housing 114. Although not specifically shown, an epoxy potting material may be injected into the inductor pockets 122 through potting ports 162 to fill in gaps formed between the inductors 144 and the primary and secondary pieces 118 and 120 of the housing 114.

The securing of the back cover 134 to the primary piece 118 and of the power module 156 to the secondary piece 120 causes a sealed fluid passageway to be formed around the inductors 144 and between the inductors 144 and the power module 156. In particular, a back (or first) portion 164 of the fluid passageway may be formed between the primary piece 118 of the housing 114 and the back cover 134. A front (or second) portion 166 of the fluid passageway may be formed between the secondary piece 120 of the housing 114 and the power module 156 (i.e., the plate to which the power module 156 is mounted). These two portions 164 and 166 of the fluid passageway are interconnected through fluid port 128 (FIGS. 6 and 7).

During operation, referring again to FIG. 1, the automobile 10 is operated by providing power to the wheels 16 with the electric motor 20 which receives power from the battery 22 and the FCPM 24 in an alternating manner and/or with the battery 22 and the FCPM 24 simultaneously. In order to power the motor 20, direct current (DC) power is provided from the battery 22 and the FCPM 24 to the inverter 28, via the BDC 32, which converts the DC power into alternating current (AC) power, before the power is sent to the electric motor 20.

The electronic control system 18 (or the BDC controller and/or the inverter control module) control the DC/DC converter system 26 and the DC/AC inverter 28. The DC/DC converter system 26 transfers power between the FCPM 24 and the battery 22. In one embodiment, the switching inductor 48 is primarily responsible for the power conversion process, as the switching inductor 48 stores energy in a first part of the operating cycle and releases it in a second part of the operating cycle. Thus, the switching inductor 48 ensures that the energy transfer takes place in the desired direction, regardless of the voltaic relationship between the FCPM 24 and the battery 22, and a constant average current, equal to the desired average current, is impressed through the switching inductor 48.

Referring now to FIG. 13, in order to regulate the temperature of the power electronics assembly 100, a cooling fluid may be provided to fluid port 140 (FIG. 5) and then flow between the power module 156 (FIG. 4) and the inductors 144 through the front portion 166 of the fluid passageway. The fluid then flows through fluid port 128 into the back portion 164 of the fluid passageway, where it passes between the back cover 134 and the inductors 144. The fluid then leaves the housing 114 through fluid port 126. In the front and back portions 166 and 164 of the fluid passageway, the various series of raised and recessed formations (e.g., the cooling pins 142 and the cooling fins 132) (FIGS. 7 and 10) increase the surface area through which heat may be conducted to the cooling fluid.

One advantage of the power electronics assembly described above is that because the fluid passageway extends around both sides of the inductors, the amount of heat that may be transferred from the inductors is increased. As a result, the performance of the power electronics (e.g., either as a DC/DC converter or a DC/AC inverter) is improved. Another advantage is that because the fluid passageway extends between the power module and the inductors, the power module may be cooled using the same coolant loop as the inductors. As a result, the complexity and size of the cooling system, as well as the total number of parts required, are reduced, thereby reducing manufacturing time and costs. A further advantage is that because of the increased surface area created by the various series of raised and recessed formations (e.g., the cooling pins 142 and the cooling fins 132) heat transfer from the inductors is further improved, resulting in even greater performance.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A power electronics assembly comprising:
a housing defining at least one cavity and having a fluid passageway extending through the cavity, the fluid passageway having first and second portions extending through respective first and second opposing sides of the at least one cavity, wherein the housing comprises first and second side walls each comprising inner surfaces and outer surfaces, the inner surfaces having a recessed formed thereon, the first and second portions of the fluid passageway being formed within the respective first and second side walls; and
a plurality of inductors housed within the at least one cavity of the housing such that the first and second portions of the fluid passageway are on first and second opposing sides of each of the plurality of inductors, wherein the fluid passageway also extends around the plurality of inductors within the cavity, wherein each of the plurality of inductors comprises a conductive winding arranged such that when current flows through the conductive winding, heat generated therein is conducted from the first side of the respective inductor to the first portion of the fluid passageway and from the second side of the respective inductor to the second portion of the fluid passageway, wherein each of the plurality of inductors comprises a ferromagnetic core and the conductive winding of each of the plurality of inductors is wrapped around the respective ferromagnetic core, and wherein the conductive winding of each of the plurality of inductors is at least partially located within the recesses on the inner surfaces of the first and second side walls.

2. The power electronics assembly of claim 1, wherein the outer surfaces of the first and second side walls each have a plurality of alternating raised and recessed formations formed thereon.

3. The power electronics assembly of claim 2, wherein the first and second sidewalls of the housing each comprise a cover plate coupled to the outer surface thereof, and wherein the first and second portions of the fluid passageway are formed between the outer surfaces of the first and second side walls and the cover plates.

4. The power electronics assembly of claim 1, further comprises a power module comprising a power switching device that is electrically connected to one of the inductors and that is coupled to the outer surface of the second side wall such the second portion of the fluid passageway extends between the second sides of the inductors and the power module.

5. The power electronics assembly of claim 4, wherein the power switching device of the power module is electrically connected to one of the inductors.

6. An automotive power converter assembly comprising:
a housing made out of metal, the housing comprising first and second side walls and defining a plurality of inductor cavities and a fluid passageway extending through the cavities, the fluid passageway having first and second portions extending through the respective first and second side walls on respective first and second opposing sides of the plurality of inductor cavities, wherein the first and second side walls of the housing each comprise inner surfaces having a recess formed thereon;
a plurality of inductors, each of the inductors housed within a respective one of the plurality of inductor cavities of the housing such that the first and second portions of the fluid passageway are on first and second opposing sides of each of the plurality of inductors, wherein the fluid passageway extends around the inductors within the cavities, wherein each of the plurality of inductors comprises a conductive winding arranged such that when current flows through the conductive winding, heat generated therein is conducted from the first side of the respective inductor to the first portion of the fluid passageway and from the second side of the respective inductor to the second portion of the fluid passageway, and wherein the conductive winding of each of the plurality of inductors is at least partially located within the recesses on the inner surfaces of the first and second side walls; and
a power module coupled to the housing and arranged such that the fluid passageway extends between the power module and the plurality of inductors, the power module comprising a power switching device electrically connected to one of the plurality of inductors.

7. A power electronics assembly comprising:
a housing defining at least one cavity and having a fluid passageway extending through the cavity, the fluid passageway having first and second portions extending through respective first and second opposing sides of the at least one cavity, wherein the housing comprises first and second side walls each comprising inner surfaces and outer surfaces, the outer surfaces each having a plurality of alternating raised and recessed formations formed thereon, the first and second portions of the fluid passageway being formed within the respective first and second side walls; and
a plurality of inductors housed within the at least one cavity of the housing such that the first and second portions of the fluid passageway are on first and second opposing sides of each of the plurality of inductors, wherein the fluid passageway also extends around the plurality of inductors within the cavity, wherein each of the plurality of inductors comprises a conductive winding arranged such that when current flows through the conductive winding, heat generated therein is conducted from the first side of the respective inductor to the first portion of the fluid passageway and from the second side of the respective inductor to the second portion of the fluid passageway, wherein each of the plurality of inductors comprises a ferromagnetic core and the conductive winding of each of the plurality of inductors is wrapped around the respective ferromagnetic core.

8. The power electronics assembly of claim 7, wherein the first and second sidewalls of the housing each comprise a cover plate coupled to the outer surface thereof, and wherein the first and second portions of the fluid passageway are formed between the outer surfaces of the first and second side walls and the cover plates.

* * * * *